United States Patent
Bordes

(10) Patent No.: US 7,774,181 B2
(45) Date of Patent: *Aug. 10, 2010

(54) SYSTEM AND METHOD PROVIDING VARIABLE COMPLEXITY IN A PHYSICS SIMULATION

(75) Inventor: Jean Pierre Bordes, St. Charles, MO (US)

(73) Assignee: NVIDIA Corporation, Santa Clara, CA (US)

( * ) Notice: Subject to any disclaimer, the term of this patent is extended or adjusted under 35 U.S.C. 154(b) by 6 days.

This patent is subject to a terminal disclaimer.

(21) Appl. No.: 11/925,108

(22) Filed: Oct. 26, 2007

(65) Prior Publication Data

US 2008/0043026 A1 Feb. 21, 2008

Related U.S. Application Data

(63) Continuation of application No. 11/213,338, filed on Aug. 29, 2005, now Pat. No. 7,289,941.

(60) Provisional application No. 60/658,603, filed on Mar. 7, 2005.

(51) Int. Cl.
*G06F 7/48* (2006.01)
(52) U.S. Cl. .......................................................... 703/6
(58) Field of Classification Search ..................... 703/6, 703/7
See application file for complete search history.

(56) References Cited

U.S. PATENT DOCUMENTS

| 5,764,241 | A  | * | 6/1998  | Elliott et al.    | 345/473 |
| 5,777,621 | A  | * | 7/1998  | Schneider et al.  | 345/428 |
| 6,160,907 | A  | * | 12/2000 | Robotham et al.   | 382/154 |
| 6,215,495 | B1 | * | 4/2001  | Grantham et al.   | 345/419 |
| 6,476,802 | B1 | * | 11/2002 | Rose et al.       | 345/419 |
| 7,050,955 | B1 | * | 5/2006  | Carmel et al.     | 703/6   |
| 2001/0026272 | A1 | * | 10/2001 | Feld et al.     | 345/419 |
| 2005/0075154 | A1 | * | 4/2005  | Bordes et al.   | 463/1   |

OTHER PUBLICATIONS

Author: Koji Ashida; Title: Optimising the Graphics Pipeline; Date: Jan. 30, 2004; Location of document: http://developer.nvidia.com/object/g raphics_perf_opt_ChinaJoy2003.html.*
Author: Fernando Randima and Kilgard, Mark J.; Title: The Cg Tutorial: The Definitive Guide to Programmable Real-Time Graphics; Date: Feb. 26, 2003; Publisher: Addison-Wesley; 1st Edition; ISBN: 0321194969; Pertinent pp. Chapter 1; Location of document: http:IIdownload.nvidia.comIdeveloperIcgICg_TutoriallChapter_1.pdf.*

* cited by examiner

*Primary Examiner*—Paul L Rodriguez
*Assistant Examiner*—Eunhee Kim
(74) *Attorney, Agent, or Firm*—Patterson & Sheridan, LLP

(57) ABSTRACT

A system and method of providing physics data generated by a physics simulation and consumed by main application are provided. The main application may incorporate different scene versions or varying physics-based complexity while running on systems having different hardware and software resources.

30 Claims, 9 Drawing Sheets

SYSTEM AND METHOD PROVIDING VARIABLE COMPLEXITY IN A PHYSICS SIMULATION

The present patent application is Continuation application of U.S. patent application Ser. No. 11/213,338 now U.S. Pat. No. 7,289,941 filed on Aug. 29, 2005, which claims the benefit of benefit of U.S. Provisional Application Ser. No. 60/658,603 filed Mar. 7, 2005 and entitled "System and Method Providing Variable Complexity in a Physics Simulation," the subject matter of which is hereby incorporated by reference.

BACKGROUND DISCUSSION

The invention relates generally to systems and methods adapted to, or benefiting from the incorporation of data related to physical effects. Certain embodiments of the invention are related to systems adapted to run a physics simulation with the aid of a physics co-processor, or a so-called Physics Processing Unit (PPU). Several exemplary embodiments of a PPU-enabled system are disclosed in relation to U.S. patent application Ser. No. 10/715,370 filed Nov. 19, 2003; Ser. No. 10/839,155 filed May 6, 2006, Ser. No. 10/982,764 now U.S. Pat. No. 7,475,001 and U.S. patent application Ser. No. 10/982,791 both filed Nov. 8, 2004; and Ser. No. 10/988,588 now U.S. Pat. No. 7,620,530 filed Nov. 16, 2004. The subject matter of these commonly assigned, pending patent applications is hereby incorporated by reference.

The term "PPU-enabled" generally describes any system incorporating a PPU to generate physics data for consumption by a main application running on a Central Processing Unit (CPU), such as Pentium® or similar microprocessor. The PPU and CPU may take many forms, but are generally implemented as separate computational hardware platforms capable of at least some level of mutually independent, asynchronous computational operation. Mutual independent operation certainly allows for designation of a master/slave relationship between PPU and CPU, so long as the some level of asynchronous operation is possible.

The term "physics data" comprises any data and/or data structure related to a mathematical algorithm or logical/mathematical expression adapted to solve a physics problem or express a physics-based relationship. In the context of a PC or game system, such problems and/or relationships are "virtual" in nature. That is, they exist only in animated scenes produced by a main application. This virtual existence notwithstanding, the constituent physics problems and physics-based relationships characterizing physics data are defined, at least in part, by generally recognized physics principles.

Any set of logical computations and/or algorithms operating upon physics data is termed a "physics simulation." Within the context of a PPU-enabled system, a physics simulation generally runs on the PPU in cooperation with the CPU to generate a body of physics data that accurately defines the movement and/or interaction of objects and features in an animated scene as displayed by a peripheral device associated with the system. For purposes of the description that follows, individual components within the constellation of possible objects and features capable of being displayed as part of a physics simulation will be generally terms "actors."

Such computationally derived, physics-enhanced animations form an increasingly important aspect of numerous applications. Computer games are an excellent example of applications that benefit from the added realism provided by animations derived from a defined set of physics-based parameters and data. The term "animation" is used here to generally describe any visual representation of an event or scene. The term "physics-based animation" refers to any animation derived, at least in part, from a physics simulation or least one computational process operating on physics data defining a physical characteristic or behavior of an actor in the scene. In this context, the physics simulation is often said to be driving the resulting animation. However, the direct relationship between the physics simulation and the resulting animation, and the fact that the underlying physics simulation is not apparent to the system user typically results in an alternative use of the terms "animation" and "simulation."

Conventional systems, such as Personal Computers (PCs) or Game Consoles, run various main applications, such as games, that are visually and tactilely enhanced by the incorporation of physical effects. A specialty software program resident in the system and generally referred to as a "physics engine" provides the programming tools and functional capabilities necessary to simulate various kinds of physical effects. A conventional, software-based physics engine provides a programmer with increased latitude to assign virtual mass, coefficients of friction, etc., to actors animated within a scene produced by execution of the main application. Similarly, virtual forces, impulses, and torques may be applied to the actors. In effect, the conventional physic engine provides programmers with a library of procedures to simplify the visual creation of scenes having physical effects (i.e., physics-based interactions between actors in the scene).

The physics engine typically provides, or is associated with, an Application Programming Interface (API) through which the main application may communicate with the physics engine. The physics engine API may be specially provided or it may be part of a larger, general API associated with the system or an operating system (OS) running on the system. Using the physics engine API and conventionally understood techniques, the main application creates one or more animated scenes. Scenes or scene combinations are sometimes referred to as "worlds."

In concert with the physics engine, the main application typically populates a given scene with one or more actors. Specific actors may take many forms, including; an object, an object feature or element, a visual effect, etc. Indeed, actors have been generically referred to as "objects," but this term should not be construed as being limited in this context to the customary meaning typically ascribed to only inanimate things. In the description that follows, reference to an object is merely a convenient reference to one type of actor in an animated scene.

FIG. 1A and FIG. 1B generally illustrate two possible relationships between physics engines and other selected system components. FIG. 1A illustrates a main application 1 communicating with a conventional, software-based physics engine 3 through an associated API 2. The term "API" is used throughput this description means any set of definitions or established relationships generally enabling one piece of software to communicate with another piece of software. APIs are subject to wide variations in expression and definition, but generally provide some level of abstraction usually (but not necessarily) between a lower-level and higher-level software.

FIG. 1B illustrates main application 1 communicating with a hardware-based PPU 5 through an associated API 2 and device driver 4. A device driver is a conventional piece of software enabling an application or other piece of software to interact with a hardware device, such as a PPU. Device drivers are often provided by an operating system like Windows or Linux, and may be viewed as a manual of sorts giving the operating system a set of instructions adapted to operate or interacting with the particular hardware device.

The examples illustrated in FIGS. 1A and 1B show two different implementations of a physics engine. In FIG. 1A, the physics engine is implemented wholly in software running on the system CPU. In FIG. 1B, the physics engine is largely implemented using a PPU externally provided and/or independently operating in relation to the CPU running the main application. Thus, the PPU of FIG. 1B may take the form of a PCI connected co-processor, a separate co-processor additionally provided within the system, or a separate processing core within a multi-core processor.

However implemented, the hardware and/or software components forming the physics engine cooperate to generate the physics data necessary to produce a temporal sequence of physics-enhanced animated scenes. For example, consider the scenes A and B produced by physics engine 6 of FIG. 2, each presumptively containing physical effects. Each scene comprises a multiplicity of actors ("a" through "h"), wherein the various actors are capable of interacting (e.g., affecting and/or being affected by) one with another. Actor interactions take place in the virtual physicality of the animated scene. However, conventional scenes A and B are completely independent of one another. That is, actors "a" through "e" in scene A cannot interact with actors "f" though "h" in scene B. Different scenes are like completely separate worlds—they do not influence or affect one another in any way.

As noted above, conventional software-based physics engines are implemented as libraries of sorts running on a system CPU (e.g., a main computational hardware platform in the system). Conventionally, the CPU must synchronously run the software implementing the main application with software implementing the physics engine. However, the use of multiple processors, multiple execution threads, and multiple processing core systems is becoming increasingly common. Further, the availability of PPU-enabled systems, whether the PPU is provided as a stand alone device, an add-on device, or subsystem (e.g., a PCI or PCI Express connected subsystem), an additional system processor, a designated processing core in a multi-core processor, or as a separate hardware thread, has dramatically altered the possible mechanisms and manner by which physics data may be generated and provided to a main application. That is, no matter its actual physical implementation, the PPU is well adapted to run physics simulations, because its additional processing power enables real-time simulation of larger, more complex scenes having a larger numbers of actors with more detailed geometry, texture, and features.

Unfortunately, hardware and/or software variations between different systems, each potentially running the same main application pose a significant problem to both application developers and system vendors. For example, a single commercial version of a main application would ideally be capable of running on different systems having a range of hardware and software capabilities. Differing hardware capabilities may include, for example, PPU-enhanced systems, systems comprising an up-to-date CPU or a multi-core processor, systems comprising a legacy processor or single core processor, and systems having various quantities and/or types of available memory. If on one hand, a main application is developed to incorporate a cutting-edge, complex physics simulation and therefore requires state-of-the art hardware and/or software, then only customers having high-end systems will be potential customers. If on the other hand, the main application is "dumbed-down" to be useable across a broader range of systems including older systems, then the application loses some of the potential benefits afforded by the inclusion of maximally-complex physics simulations.

SUMMARY OF THE INVENTION

Embodiments of the present invention avoid this Hobson's choice by providing a system and method adapted to provide physics data of variable complexity from a physics simulation running in conjunction with a main application.

One embodiment of the invention enable a physics data enhanced application to run properly on a variety of systems having a range of hardware and software capabilities. Another embodiment of the invention provides consistent operation or outcome of a main application on a range of competent systems having different capabilities, even where the physics simulation variably includes additional actors, animation characteristics, and/or applied forces is used to improve the visual qualities of the application.

In another embodiment, the invention allows an existing main application to be modified to make use of additional physics simulation capabilities without the risk of affecting the operation of the application. In yet another embodiment, the invention allows an existing application to be modified to make use of additional physics simulation capabilities without requiring the replacement of an existing physics engine, or physics API.

In still another embodiment, the invention provides a method, comprising; defining a first version of a scene within a main application, and defining a second version of the scene within the main application, wherein the first and second scene versions differ in their degree of physics-related complexity. The respective degrees of physics-related complexity between the first and second scene versions may differ in relation to a number of scene actors, an actor animation characteristic, or a number of forces applied to an actor.

In still another embodiment, the invention provides a method of executing a main application on a system, the main application incorporating physics data generated by a physics simulation, the method comprising; determining hardware resources available in the system to execute the physics simulation, and selecting a scene version from a plurality of scene versions based on the determination of hardware resources, wherein the plurality of scene versions vary in their degree of physics-related complexity.

In still another embodiment, the invention provides a method of executing a main application on a system having multiple execution platforms, the main application incorporating physics data generated by a physics simulation, the method comprising; determining hardware resources available in the system to execute the physics simulation, selecting a scene version from a plurality of scene versions based on the determination of hardware resources, wherein the plurality of scene versions vary in their degree of physics-related complexity, identifying an execution platform associated with the selected scene version, and executing the selected scene version using the identified execution platform. The multiple execution platforms may comprise at least one of a software-based physics engine running on a Central Processing Unit (CPU), a Physics Processing Unit (PPU) co-processor, or a combination of the physics engine and PPU co-processor.

In still another embodiment, the invention provides a method of running a physics simulation associated with a main application on a system, the physics simulation defining, at least in part, a final scene. The exemplary method comprises; by operation of the main application, calling a first execution platform to execute a first physics simulation creating a first scene comprising a first actor, calling a second execution platform to execute a second physics simulation creating a second scene comprising a second actor and a third actor, and based on a determination of hardware resources either using the first scene as the final scene or melding the first and second scenes to create the final scene.

Calling the first and second execution platforms is accomplished through a physics Application Programming Interface (API). The physics API may be provided by an operating system (OS) associated with the system and/or in association with the main application. Alternatively, calling the first execution platform may be accomplished through a first physics API associated with the first execution platform, and calling the second execution platform may be accomplished through a second physics API associated with the second execution platform.

In a related aspect, the first actor in the first scene may be a primary actor, the second actor may be a proxy actor for the primary actor, and the third actor may be an additional actor, and wherein melding the first and second scenes comprises establishing a one-way interaction relationship between the first actor and the third actor through the second actor.

In another related aspect, melding the first and second scenes may further comprise; by operation of the first physics simulation, determining state data for the second actor in relation to the first actor, communicating the state data for the second actor to the second physics simulation, and by operation of the second physics simulation following receipt of the state data for the second actor, determining state data for the third actor.

In yet another related aspect, the second physics simulation may not change the state of the second actor.

In still another embodiment, the invention provides a method of running a physics simulation associated with a main application on a system, the physics simulation defining, at least in part, a final scene and the method comprising; from the main application, calling an execution platform to create a first scene comprising a first actor and a second scene comprising a second actor and a third actor, and based on a determination of hardware resources either using the first scene as the final scene or melding the first and second scenes to create the final scene, and thereafter rendering the final scene on a display associated with the system.

BRIEF DESCRIPTION OF THE DRAWINGS

Exemplary embodiments of the invention are described below in relation to the attached drawings in which.

DESCRIPTION OF EXEMPLARY EMBODIMENTS

Figure 1A:
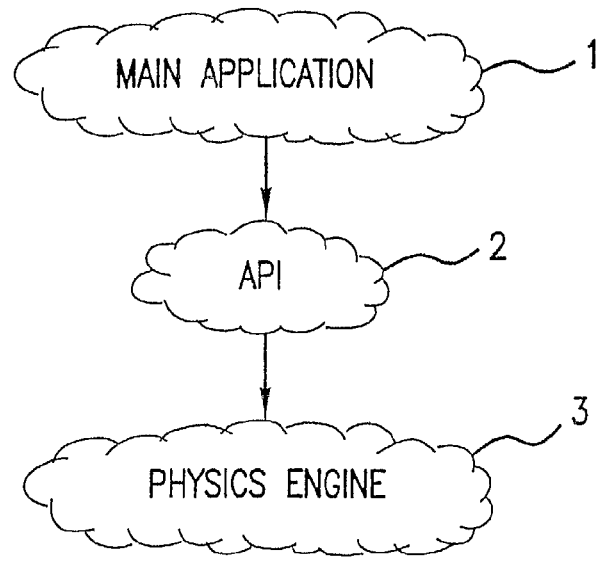
FIGS. 1A and 1B are system diagrams illustrating conventional systems incorporating different types of physics engines.
Figure 1B:
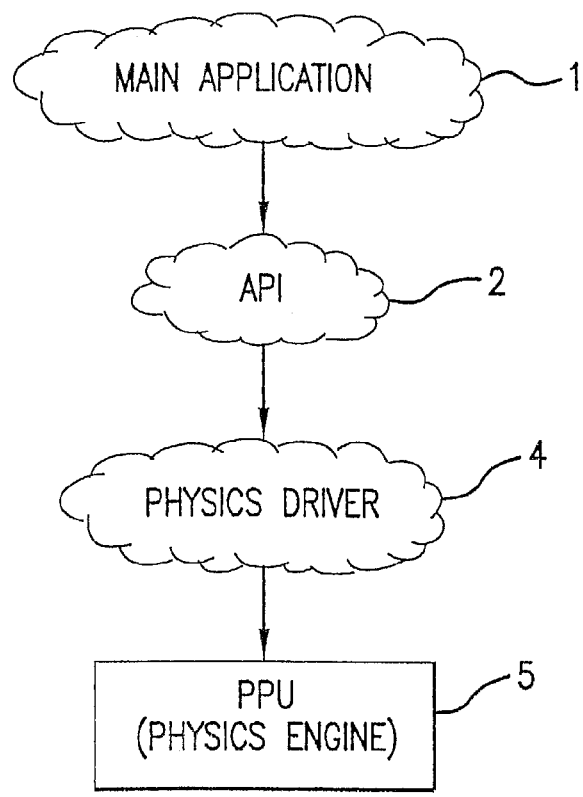
Figure 2:
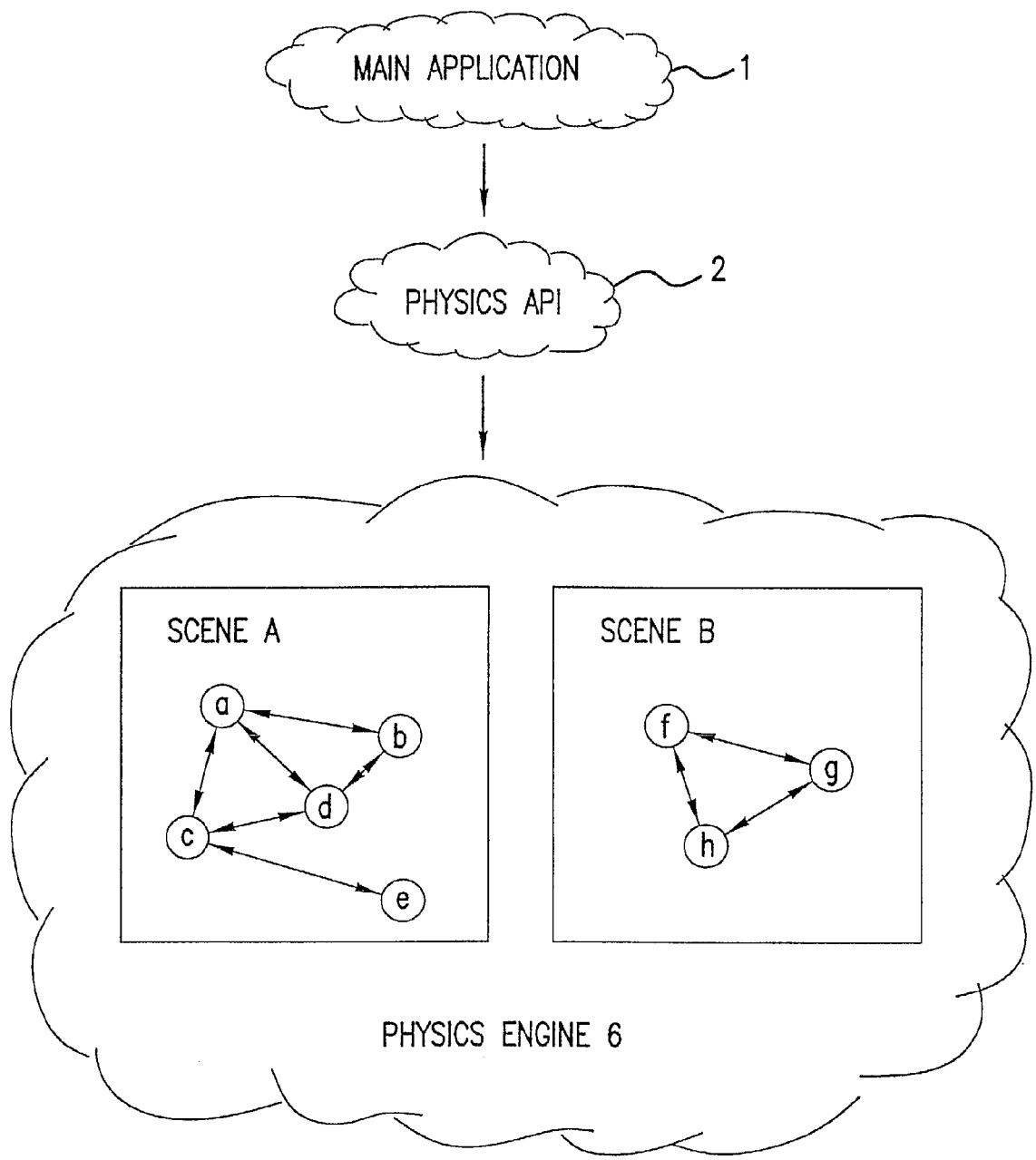
FIG. 2 is a system diagram illustrating generation of independent scenes in conventional physics engine.

Embodiments of the invention will now be described with reference to the accompanying drawings. These embodiments are presented as teaching examples. In order to clearly teach the making and use of the invention, the exemplary embodiments are directed to specific implementations of exemplary systems and methods. The invention is, however, not limited to only these selected examples, but is defined by the claims that follow.

In one aspect, the invention recognizes the continuing demand for the type of additional realism provided by the incorporation of physics data within various types of main applications. However, the improved look and feel provided by complex physics data within a main application is only useful where the physics simulation generating the physics data runs in real time. That is, physics-enhanced animations generated by a main application are only desirable if execution of the underlying physics simulation(s) does not visually impair or interfere with execution of the main application.

The demand for increasingly realistic animations is best met, at least in a commercial context, by providing a single application capable of running on different systems characterized by a range of computational capabilities (e.g., legacy versus contemporary). To a great but not exclusive extent, the computational capabilities of a system are defined by its available hardware resources. Accordingly, an ideal main application would tailor the quantity of physics data to-be-incorporated (and therefore the complexity and run-time characteristics of the underlying physics simulation(s)) to the hardware resources available in a system. This is particularly true where an application is being run on a PPU-enabled system.

While the provision of a PPU offers system designers and main application developers remarkable new capabilities, these potential capabilities present significant additional challenges. As noted above, a main application should be compatible with a range of systems including legacy systems. Legacy systems may lack the hardware resources, such as a PPU, an up-to-date CPU, a multi-core processor, and/or a sufficiently capable memory system, required to run a main application mandating incorporation of physics data generated by a sophisticated physics simulation.

Accordingly, in one embodiment, the invention contemplates a main application capable of generating multiple versions of a given scene, wherein the multiple versions are distinguished by variable complexity of the physics data incorporated into the scene. That is, each scene version is characterized by a particular level or degree of physics-related complexity. This variable complexity of physics data necessarily implicates a varying level of complexity in the underlying physics simulation generating the physics data. The varying level of complexity in the underlying physics simulation necessarily implicates a consideration of available system resources adapted to execute the physics simulation. Thus, the system and/or method provided by one embodiment of the invention allow a main application to generate multiple scene versions of varying physics-related complexity which implicate underlying physics simulations (or different portions of a physics simulation) of varying sophistication, such that the quantity and/or quality of the physics data to-be-incorporated in the main application is properly aligned with available system resources.

Scene versions may vary in their respective level or degree of complexity in any reasonable manner. For example, varying degrees of physics-related complexity may be characterized by the use or incorporation of a different number of scene actors, a different animation characteristic associated with one or more of the actors, and/or a different number of applied forces (e.g., constraints) associated with one or more of the actors.

The term "animation characteristic" in this regard refers generally to any animation detail or quality defined in relation to physics data. For example, a less-detailed scene version may have a character-type actor dressed in a non-detailed, rubber-looking suit that maintains a relatively static shape. In contrast, a more-detailed version of the same scene might provide the same character-type actor with a cloth-simulated suit that visually flows in a natural way with the actor's movements or with external forces applied to the actor. The first scene version might require little, if any, physics data to animate the actor's suit. The second scene version might require execution of a cloth simulation subroutine—a highly complex computationally task. Other examples of an animation characteristic that may be ascribed to one or more actors in a scene version include the various use of particles emitters, fluid emitters and drains, fractures, deformations, etc.

Regardless of the type or quality of variation in physics-related scene complexity, by executing one or more scene versions appropriately selected from a plurality of possible scene versions, an acceptable run-speed (or frame rate) for the underlying physics simulation may be maintained across a range of systems, old or new alike. Those of ordinary skill in the art will recognize that many contemporary systems have the ability to determine hardware capabilities during system (or main application) initialization. Such a hardware capabilities determination may be used in the context of embodiments of the invention to appropriately select an allowable level of complexity for a physics simulation to-be-associated with the main application. That is, scene versions having an appropriate degree of physics-related complexity may be selected in relation to a hardware capabilities determination made by the system (e.g., the operating system associated with the system) and/or the main application.

Figure 3:
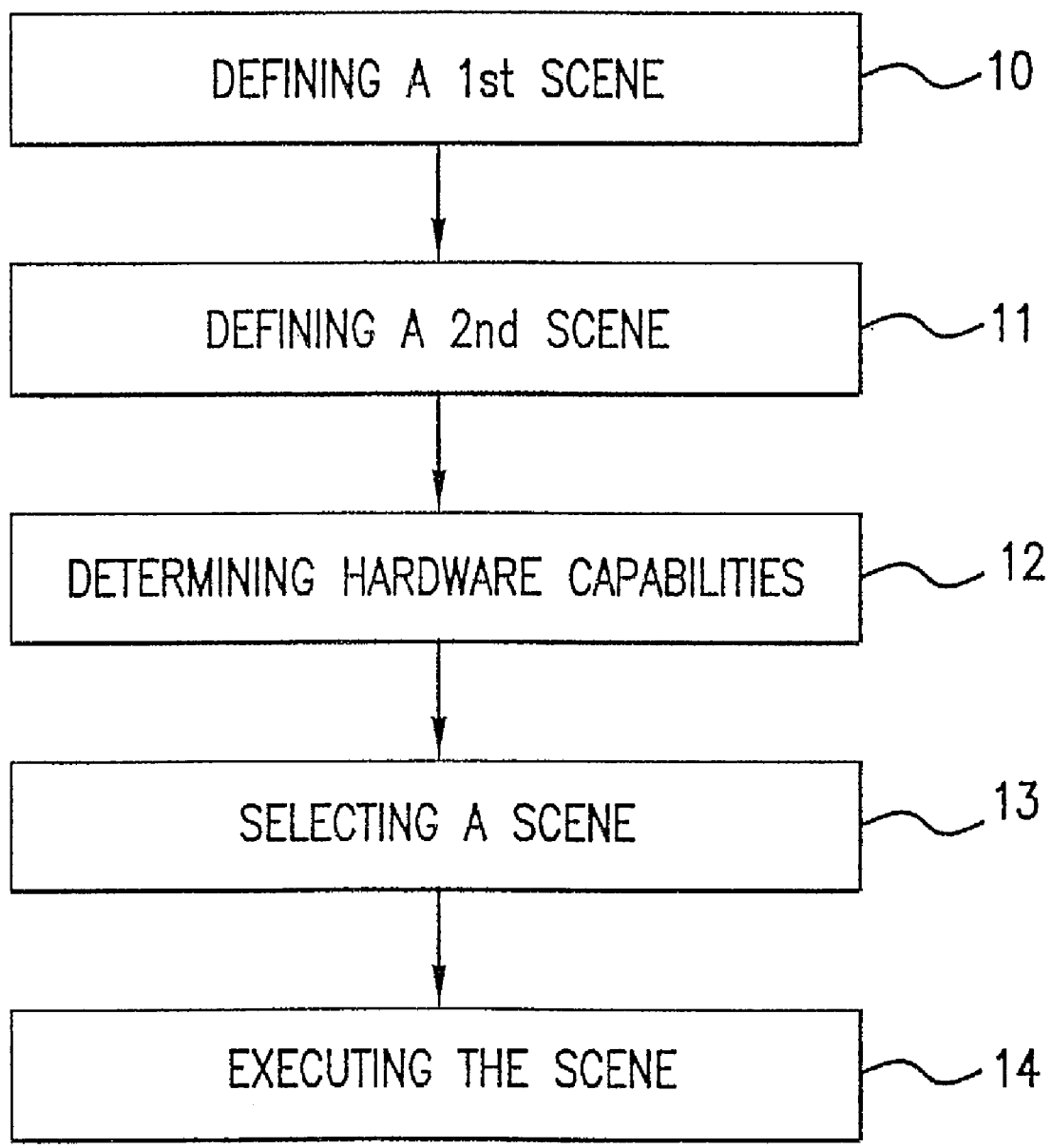
FIG. 3 is a flowchart illustrating one aspect of the invention.

An exemplary and general method of selecting between scene versions is illustrated in FIG. 3. Multiple versions (here, first and second, but more might be provided) of a scene to-be-generated during execution of a main application are defined during development of the main application or during initialization of the main application on a system (10 and 11). Thereafter, the main application either directly determines the hardware resources available in the system, or receives this information from an operating system running on the system (12). With knowledge of the hardware capabilities available in the system, the main application then selects between the multiple, possible scene versions (13). During execution of the main application, the selected scene is executed in its proper place within a sequence of scenes (14).

The process of defining multiple scene versions may be as simple as writing separate selectable subroutines corresponding to each scene version during development of the main application. Alternatively, a core scene subroutine may be altered (amended or redacted) by other subroutines in accordance with the hardware capabilities determination in order to dynamically define an appropriate subroutine (and therefore the selected scene version) during initialization or execution of the main application.

Subroutines defining different scene versions may incorporate different (or multiple) "calls" to a physics engine and/or a PPU subsystem in order to receive the desired physics data. Those of ordinary skill in the art will understand the use of variable or modular software subroutines and related calls to define the subroutines underlying the different scene versions, as well as the different physics subroutines associated with each scene version.

Alternatively, the process of selecting between the multiple scene versions may be as simple as loading a selected scene version from a library of possible scene versions during initialization of the main application.

The term "executing the selected scene version" is used above and hereafter to generally describe the process (or related processes) involved in the execution of software underlying the scene, whether such software is present in the main application and/or some other source such as a PPU-based physics subroutine. The selected scene itself is not actually being "executed" using the system's hardware resources, but rather the underlying software associated with the scene is being executed in order to generate data susceptible to an animation associated with the scene. This animation is then displayed on a device (e.g., a CRT or LCD screen) associated with the system. As the resulting animation is the only thing apparent to a system user, the scene is said to be executed, i.e., computationally derived and visually communicated to the user. In this context, a scene may be executed using a conventional physics engine running on a system's CPU and/or using a PPU running some portion of a physics simulation associated with the main application.

A main application adapted or developed accordingly to the dictates suggested by the foregoing embodiments offers enhanced commercial utility to a broad range of users. For example, consider a main application having three versions of a particular scene. The first version is a minimally complex one having only a few essential actors and little, if any, associated physical effects. This version is intended to run on base systems having hardware resources minimally competent to run the main application.

The second version incorporates significant additional physics-based complexity in the form of more actors, enhanced animation characteristics, and/or additional applied forces. This version is intended to run on newer systems having top-end commercially available hardware, such as a very fast or multi-core CPU and an expanded memory over the base system capabilities.

Finally, the third version incorporates a full package of physics-based complexity, including numerous additional actors enhanced with multiple animation characteristics and being acted on by multiple applied forces. This version is intended to run on a newer, PPU-enabled system capable of executing a very sophisticated set of physics subroutines asynchronously and in parallel with CPU execution of the main application.

By selectively providing different versions of the scene with differing degrees of physics-based complexity, the main application becomes marketable across a broad range of prospective customers having a diverse array of systems. Further, each customer receives the maximum bang for his relative hardware buck, because the main application incorporates the most complex scene version sustainable by the customer's system capabilities.

Figure 4:
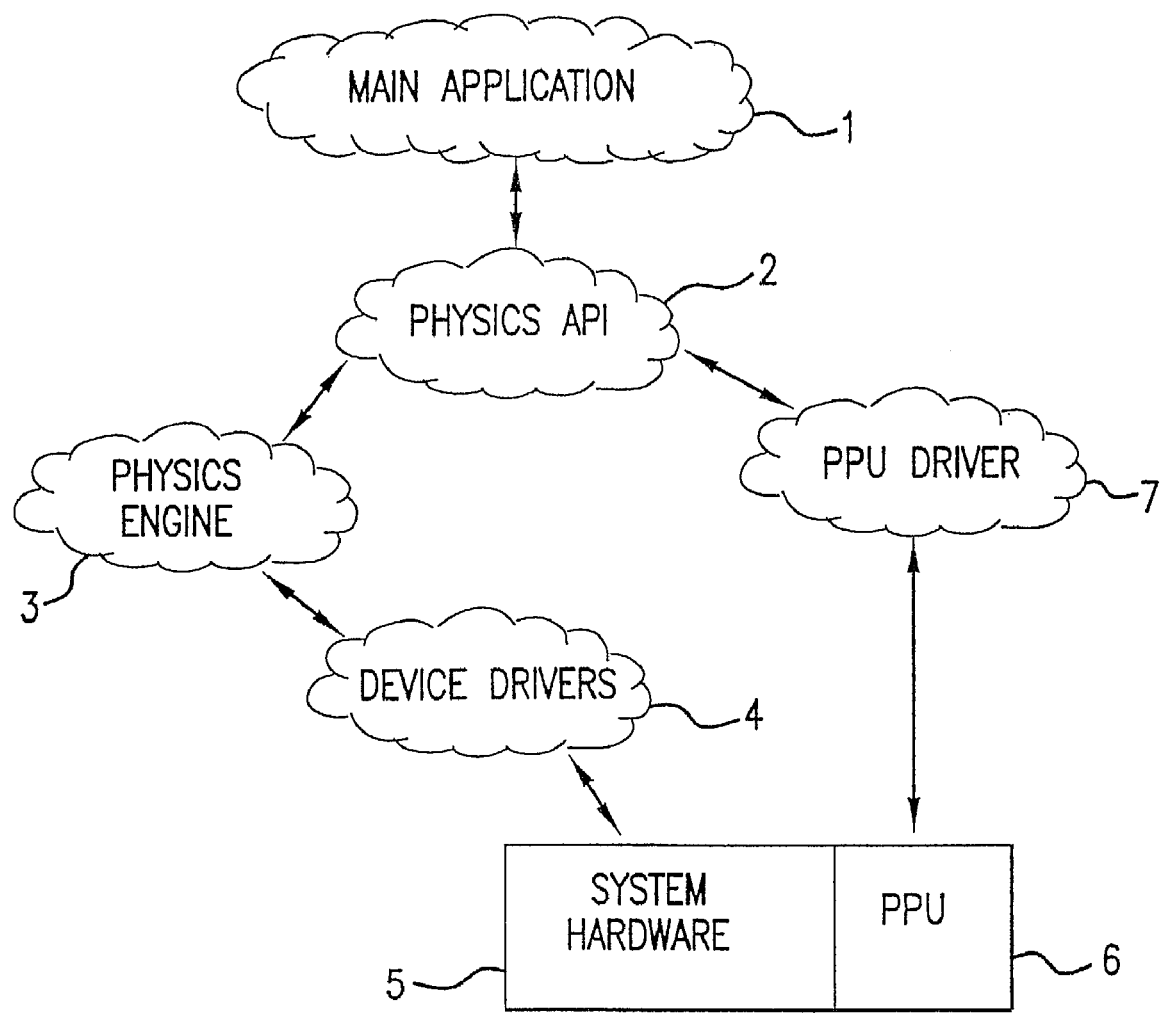
FIG. 4 is a system diagram illustrating one exemplary system adapted to the invention.

Consider now, the foregoing approach to main application development and definition in the context of an exemplary system shown in FIG. 4. The system of FIG. 4 recognizes in one aspect, the possibility of running a main application 1 having multiple scene versions that vary by physics-related complexity on a PPU-enabled system also incorporating a legacy physics engine. This circumstance might easily arise, for example, when a stand-alone (e.g., PCI or PCI Express-connected) PPU is added to a system having (or subsequently receiving) a legacy, software-based physics engine running on the system CPU.

This exemplary system may be viewed as having two (2) separate physics engines—a conventional software physics engine and a hardware PPU-based physics engine—each having its own unique set of computational capabilities.

The exemplary system shown in FIG. 4 further comprises main application 1 communicating through physics API 2 with physics engine 3 and the combination of PPU driver 7 and PPU 6. In one embodiment of the invention, only a single physics API is provided. Of course, the physics API may be provided using multiple software packages or modules, but the term "single" in this context means physics API 2 acts a competent unitary agent providing main application 1 with a library of commands and/or definitions that relate to both physics engine 3 and PPU 6. Obviously, not all commands and definitions provided by physics API 2 must be applicable to both physics engine 3 and PPU 6, but usually some common command(s) and/or definition(s) will be provided.

In this embodiment, PPU driver 7 may be any software package adapted to communicate data and commands resulting from execution of main application 1 to hardware (e.g., computational units and/or memory) associated with PPU 6. For example, PPU driver 7 may take the form of software generating and communicating conventional PCI or PCI Express data packets between the system and PPU 6. Physics engine 3 may be conventional software package accessing system hardware resources 5. It is also possible that physics engine 3 might be implemented (wholly or partially) using firmware or hardware, and that access to system hardware resources 5 may involve the use of one or more conventional device drivers 4.

One of the foregoing examples specifically provides for a single physics API. However, other embodiments of the invention need not provide only a single physics API. These alternate possibilities arise from the two very different approaches to the provision and publication of an API. Those of ordinary skill in the art will recognize that some companies jealously guard the details of their proprietary APIs (e.g., Sony Corporation and the official PlayStation® API). Other companies openly promulgate their APIs (e.g., certain Microsoft® APIs). As a result of these two different approaches to API provision, some APIs are open and standardized, and are preferably provided by an operating system like Windows. Other APIs are proprietary and are typically provided as part of the main application or software associated with the main application.

Various embodiments of the invention are contemplated within the context of either of these two approaches. For example, where provided as part of a standard operating system, physics API 2 will preferably be applicable in great (if not full) measure to both the legacy physics engine 3 and the PPU 6. In this manner, the main application may make optimum use of a standardized API resource, yet provide multiple scene versions that vary in physics-related complexity, where a less complex scene version may be run using only the legacy physics engine 3 while another more complicated scene version may be run using PPU 6 and/or legacy physics engine 3.

Naturally, other embodiments of the invention may use a physics API associated with physics engine 3 and another separately provided physics API associated with PPU 6. Such separate provision of multiple physics APIs while acceptable, places some additional strain on the developers of main application 1, where the main application comprises multiple scene versions having varying degrees of physics-related complexity, and where respective scene versions are intended to run, at least in part, on PPU 6 and/or physics engine 3.

Regardless of the approach to API provision, embodiments of the invention provide an ability to not only select between a multiple scene versions that vary in physics-related complexity, but also an ability to execute the selected scene version on an identified execution platform. In this context, "execution platform" may comprise hardware, software, and/or hardware and software. Consider the general flowchart shown in FIG. 5.

Figure 5:
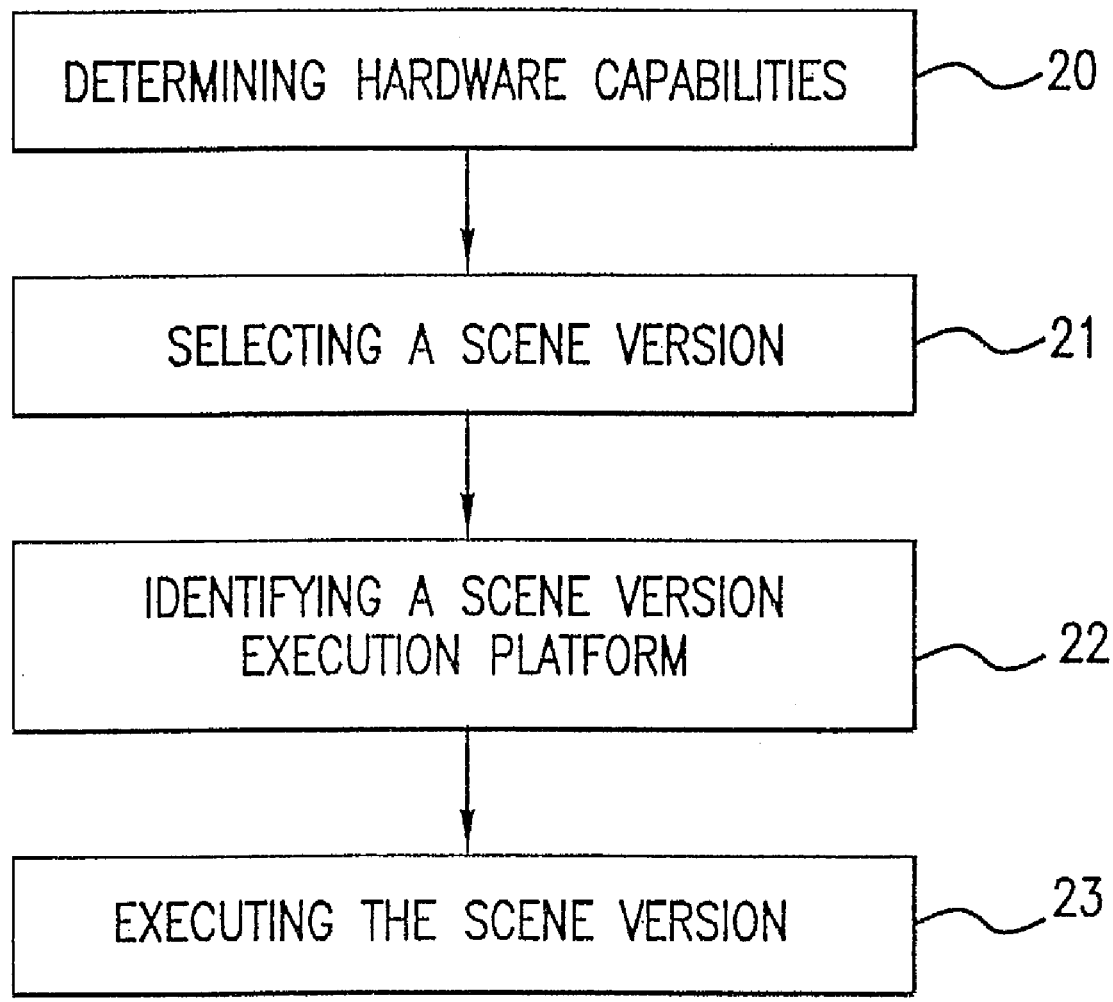
FIG. 5 is a flowchart illustrating another aspect of the invention.

In FIG. 5, a hardware capabilities determination is made (20). Thereafter, one or more scene version(s) is selected from a plurality of possible scene versions (21). The selected scene version(s) will have associated with it an identified execution platform (22). Using the identified execution platform, the main application thereafter executes the selected scene version using one or more appropriately provided APIs (23).

For example, a basic scene version may be best executed on an execution platform formed from only a legacy, software-based physics engine, regardless of the presence or absence within the system of a second physics engine, such as a PPU. In contrast, a more complex scene version might only be "selectable" when a PPU is present in the system. However, the more complex scene might be preferably executed using an execution platform comprising the PPU alone, or the PPU and legacy physics engine working in concert.

The provision and use of multiple scene versions that vary in physics-related complexity and that are potentially run on different execution platforms raise several interesting issues. These issues will be addressed for the sake of clarity in the context of a specific teaching example. The implicated issues and their adjudication within embodiments of the invention are nonetheless applicable across a range of system and main application types.

In current practice, physics engines are frequently used by game applications. Games are just one type of main application susceptible to the benefits of the invention, but because they are widely appreciated by a range of users, a game application will serve as our working example. In game applications, it is highly desirable that game playability (i.e., the quality of interaction between the system user and the system running the game that define the user's experience) be unaffected by the type of execution platform actually running the game application. However, the speed and quality with which "physics data" (e.g., the position, speed, and/or orientation of the actors in a scene) is generated by a physics simulation as well as the quantity and quality of the physics data provided to the game application will seriously affect its playability. Hence, the blind creation of multiple scene versions, each having a different degree of physics-related complexity and, therefore, each potentially implicating a different underlying physics simulation, would result in undesirable variations in game playability, as between different systems having different execution platforms. Further, it may be desirable for the behavior or characteristics of selected actors in a scene to be the exactly the same for all versions of the scene, regardless of the relative degree of physics-related complexity incorporated in to various scene versions. This consistency of actor behavior or characteristics may also be desirable regardless of the execution platform being used to run respective scene versions. Thus, embodiments of the invention contemplate main application development and execution in which some scene actors have an existence or characteristic that will varies with the level of physics-related complexity associated with a particular scene, and other scene actors that never vary.

Of further note, many game applications use (or will use) conventional physics engines that will not run properly on multi-processor, multi-core processor, or PPU enabled systems. Replacing existing conventional physics engines with a new execution platform that supports such enhanced systems is highly undesirable because the old physics engine and new execution platform (e.g., a new physics engine) will typically interface through syntactically and semantically different API's, thus requiring significant game development time and effort to make the change. Furthermore, different physics engines will typically use at least slightly different algorithms, and may therefore produce at least slightly different outputs for the same input. In many main applications, particularly games, even a small difference can have a large detrimental effect on the overall execution of the application.

In view of these issues, embodiments of the invention provides techniques for beneficially utilizing the additional physics processing resources available on certain systems to run a main application, without producing undesirable variations in the application's behavior.

Consider, for example, an exemplary system like the one illustrated in FIG. 4 assumed to be running a game application. The game application is assumed to be a sequel of a highly successful previous version of the game, where the previous version of the game has a well defined relationship with a conventional, software-based physics engine. In the working example, however, the game sequel is executed on the PPU-enhanced system (e.g., the user recently upgraded his system by adding a PCI-connected PPU). Within this context, embodiments of the invention allow the PPU-enhanced system to run the game sequel without necessarily replacing (or substituting out) the legacy physics engine and without manifestly affecting game playability.

In the context of one embodiment of the invention that successfully achieves this result, a game application creates a first scene by making calls through a physics engine API to a first physics engine. The first physics engine may be viewed in this context as the principal portion of a first execution platform. In one example, the first execution platform comprises a legacy physics engine (e.g., conventional physics middleware running on a CPU), but may alternatively comprise a selected processor core, or a first hardware execution thread. In a related embodiment, the first execution platform may be designated as a default platform which is assumed during initialization of the system or the game application. One or more actors are created in the first scene by operation of the first execution platform.

In the working example, the operating system and/or the game application is adapted to make a hardware capabilities determination. This may occur before, during, or after the creation of the first scene. This determination will identify whether additional computational resources (e.g., another physics engine, another processor, another available processor core, another available execution thread, and/or a PPU co-processor) are present in the system beyond the first execution platform. If present, these additional computational resources will be designated as a second execution platform. Where a competent second execution platform is present in the system, the game application creates a second scene by making calls to a physics API associated with the second execution platform. (This may or may not be the same physics API used to call the first execution platform). Additional actors over and above those created in the first scene are created by within the second scene. Additional scenes with additional actors may be created using additional execution platforms available in the system.

Figure 6:
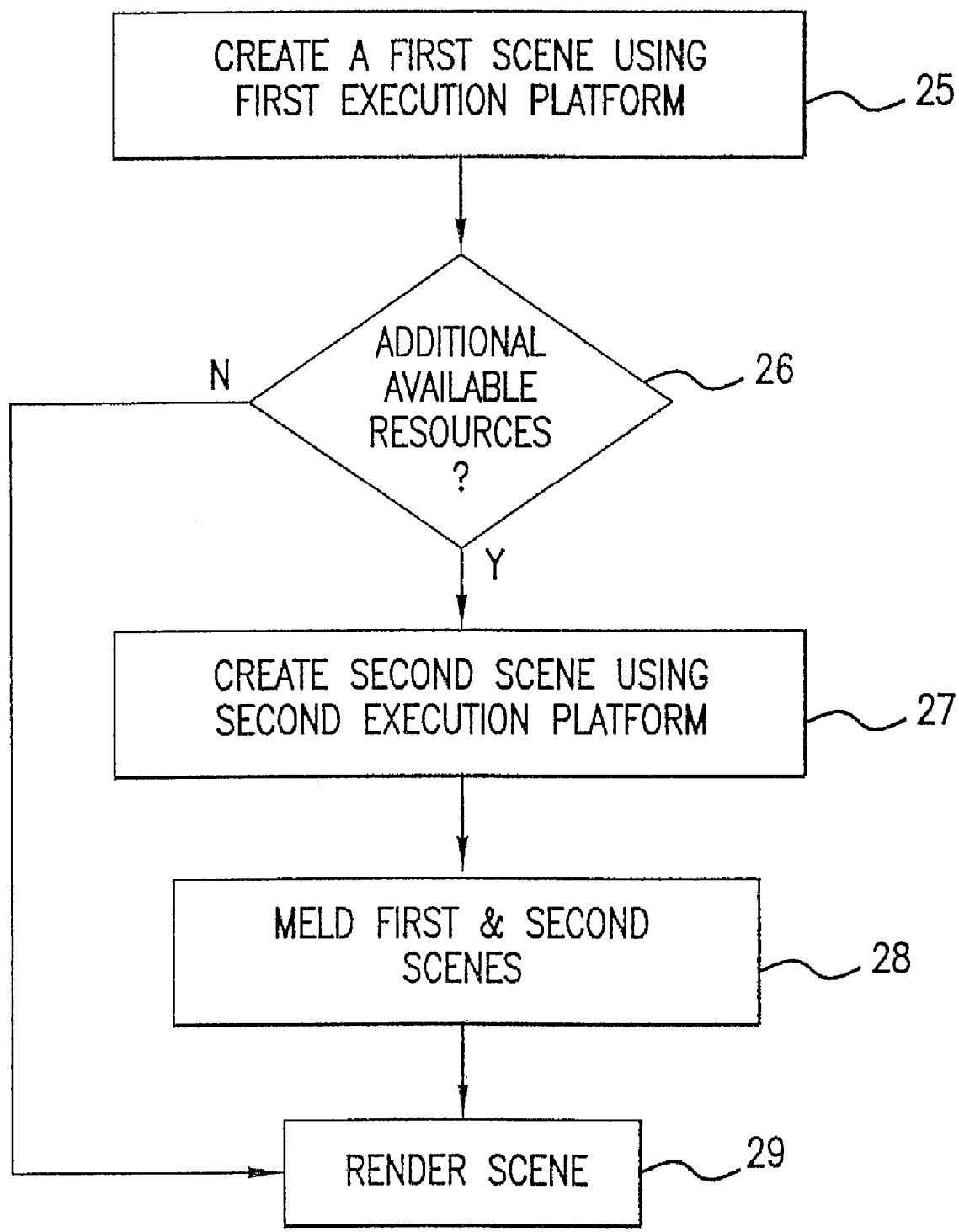
FIG. 6 is a flowchart illustrating yet another aspect of the invention.

The flowchart shown in FIG. 6 illustrates this process. A first scene is created using a first execution platform (25). Drawing upon information derived during a hardware capabilities determination, the operating system and/or the game application determines whether additional computational resources are available (26). Where competent additional resources are not available, such as in the context of a basic system, the final scene is rendered (29) on the basis of only the first scene.

However, where competent additional resources are available, a second execution platform is identified and used to create a second scene having additional actors beyond those previously created in the first scene (27). Upon completion, the first and second scenes are melded to form a body of data defining the final scene (28). Using this aggregated body of data, the final scene may be rendered by the system (29).

In the foregoing example, the first and second scenes are not scenes in the conventional sense, since conventionally scenes are independent and do not interact one with another. Here, however, one result of the foregoing exemplary method is the creation of multiple scenes (or multiple scene portions, if you will) that are subsequently melded together to generate a final scene capable of being rendered by the system. Thus, the first and second execution platforms preferably must run in parallel, at least to some extent, to generate the physics data necessary to render the final scene.

There are multiple possible ways to effectively meld scene data derived from multiple execution platforms. For example and with reference to FIG. 7, in one embodiment of the invention, a main application 1 makes calls to a first execution platform through a physics API 2 to create a first scene 30 comprising actors (a through c). Main application 1 also makes calls to a second execution platform through physics API 2 to create a second scene 32. Second scene 32 comprises additional actors (d through f) and "proxy" actors (a' through c'). Each proxy actor corresponds to an actor (a through c) created by the first execution platform in the first scene 31.

Each proxy actor created in the second scene has the same properties and characteristics as the corresponding actor found in the first scene. Proxy actors participate (i.e., have affect and are affected) in the physics simulation underlying creation of the second scene, as if they were regular actors in the second scene, with one very important exception. This exception provides that the "state" (e.g., the position, velocity, orientation, etc.) of each proxy actor may not be modified within the physics simulation being run on the second execution platform. Instead, during each time step in the physics simulation (e.g., each frame), main application 1 uses physics API 2 to query the first execution platform regarding the state of each actor (a through c) created in the first scene 30. (The state of each first scene actor may of course be changed by the physics simulation running on the first execution platform).

With knowledge of the current state of the first scene actors (a through c), main application 1 may call the second execution platform through physics API 2 to modify the state of the corresponding proxy actors (a' through c') in the second scene 32. Once the state of proxy actors (a' through c') has been properly updated in the second scene, the second execution platform may proceed and, if required, change the state of the additional actors (d through f) in the second scene.

In this manner, all "primary" actors may potentially interact with each other in the first scene, and all primary actors may also potentially interact with all additional actors in the second scene through a corresponding proxy actor. However, the additional actors in the second scene may not affect the state of the proxy actors in the second scene (or the states of the primary actors in the first scene) during execution of the physics simulation running on the second execution platform.

This one-way (primary to proxy to additional actor) interaction allows the main application to use physics data associated with and/or provided by a "primary" physics simulation running on a first execution platform to govern the overall operation of the application (e.g., determine game playability), while also using additional physics data provided by a secondary physics simulation running on a second execution platform, without the hazard of the additional physics data interfering with (e.g., adversely affecting) operation of the application. In this manner, remarkably detailed and visually impressive physics data may be included in a final scene—where resources in the system allow execution of the physics simulation(s) necessary to generate the additional physics data—while avoiding some unfortunate outcome where a secondary actor (e.g., a visually desirable buy non-essential actor) adversely affects operation of the application (e.g., game playability).

Figure 7:
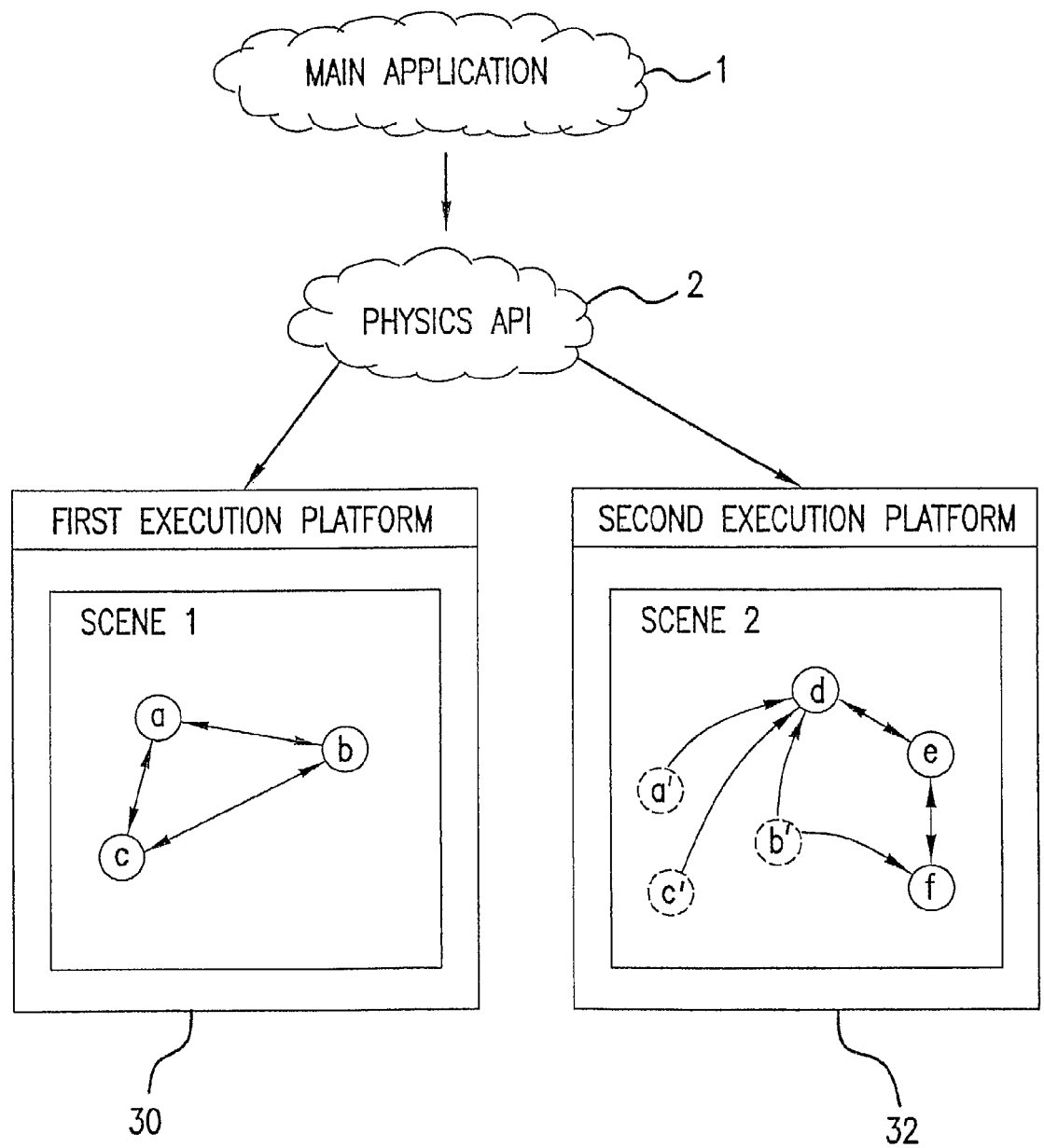
FIGS. 7, 8, and 9 are system diagrams illustrating various scene generation approaches consistent with selected aspects of the invention.
Figure 8:
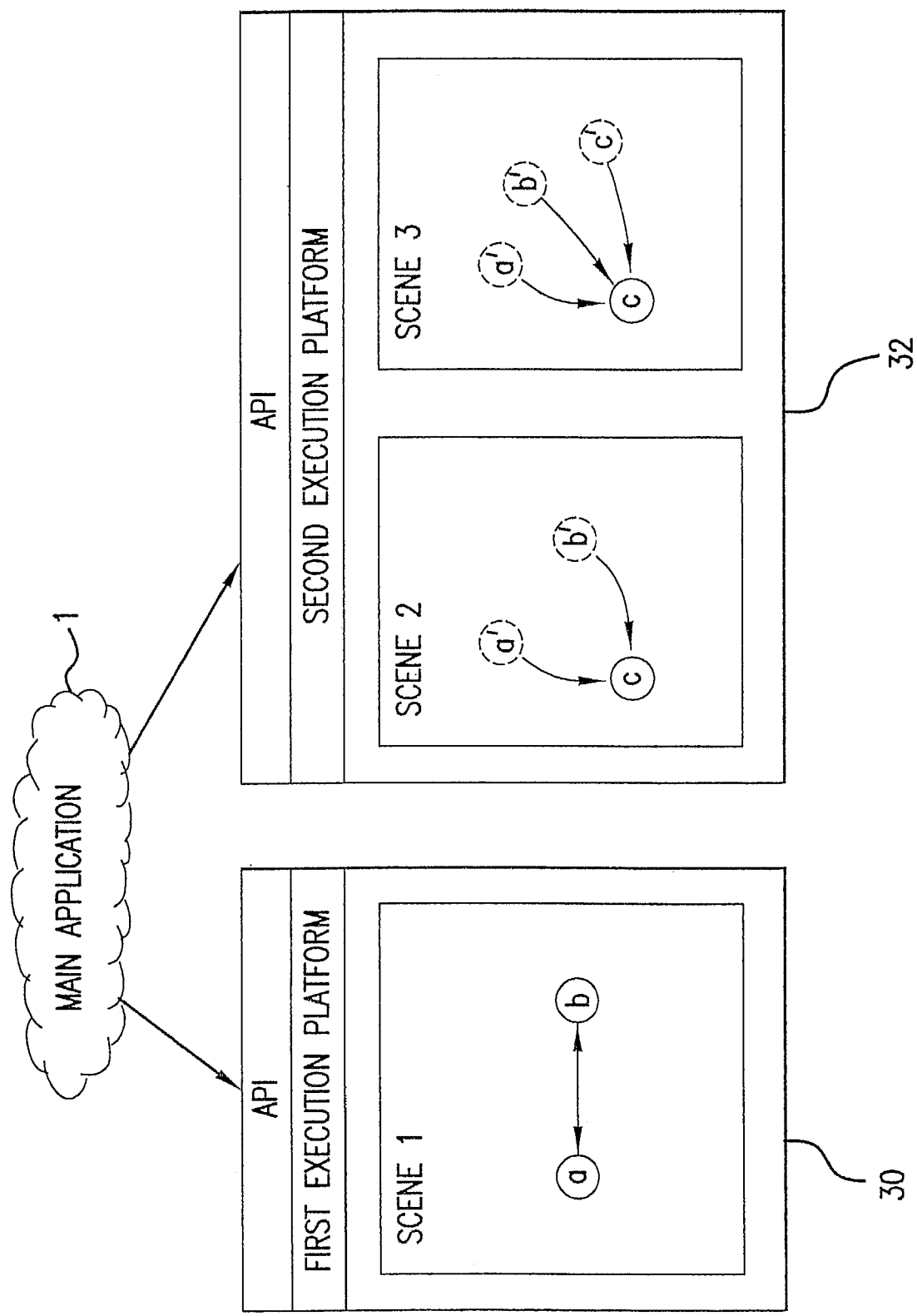

The example illustrated in FIG. 7 shows only a single physics API, but alternatively, each execution platform may be associated with its own API. Similarly, only two execution platforms and two resulting scenes are described in relation to FIG. 7, but additional execution platforms might be used to generate additional related scenes having variously subordinated primary/proxy and proxy/additional actor relationships. Alternatively, multiple scenes may be created using a single execution platform. See, for example, FIG. 8. The term "execution platform" as used throughout this description broadly encompasses any reasonable combination of software (e.g., a physics engine, physics middleware, or other specialty software), and/or hardware (e.g., a CPU, additional processor, core, execution thread, or separately provided PPU co-processor) adapted to run one or more physics simulation(s).

Figure 9:
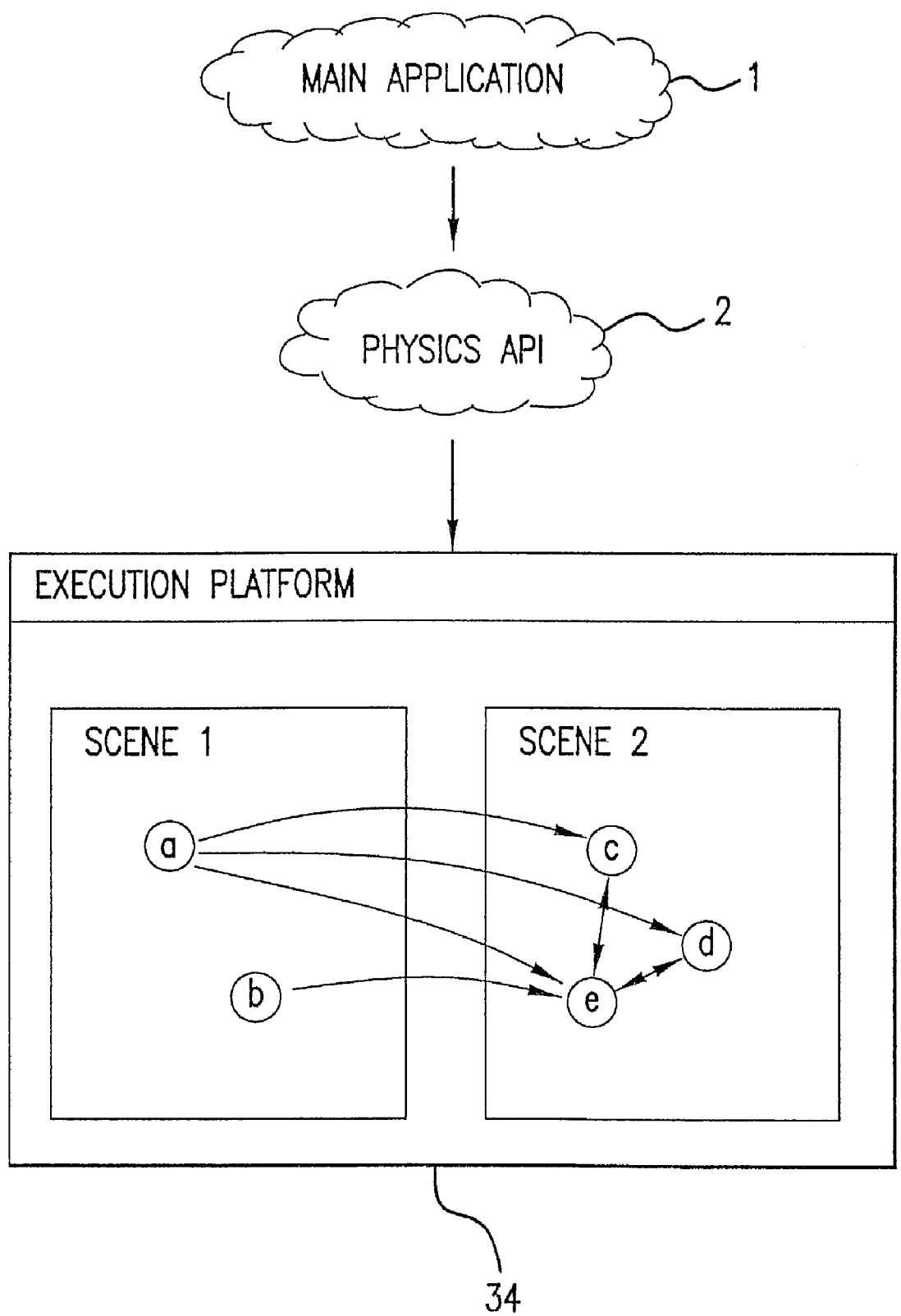

In yet another embodiment of the invention generally illustrated in FIG. 9, a single execution platform or physics engine 34 is used to create multiple scenes. A first scene is created with primary actors (a and b). A second scene is created with additional actors (d through f). Although proxy actors might be used in this example to meld the two scenes, another approach is possible here because only a single execution platform creates both scenes.

In this alternate approach, physics API 2 provides an interface, whereby main application 1 is able to establish one-way interaction relationships between actors in multiple scenes created by a single execution platform. Thus, instead of creating proxy actors, main application 1 simply calls an appropriate command or establishes an actor definition type using physics API 2. This approach does not require main application 1 to update proxy actor state information during each simulation time step. Instead, execution platform or physics engine 34 automatically uses the current state and other data associated with each actor in the first scene to properly execute the physics simulation determining the second scene (i.e., to thereby determine the state information for actors in the second scene).

However, in this approach, the physics engine need not modify the state data of primary actors as it normally would if the primary actors were actually part of the second scene. This reduces the overall computational burden on the main application, and also potentially improves performance of the physics simulation (e.g., speed) by eliminating many of the multiple API calls that characterize the previously described embodiments, for example. However, the approach illustrated in FIG. 9, as applied to a legacy main application may require the replacement of an existing physics engine with a new physics engine or an analogous execution platform that supports an API enabling the definition of one-way interactions between actors in multiple scenes.

Additional scenes may be created and handled similarly within this embodiment. For example, a third scene may be created, and the main application may issues calls to the physics API to enable one-way interaction between the first and third scene actors, or it may additionally enable one-way interaction between the second and third scene actors.

The invention, as implemented in any one of the foregoing or similar embodiments, provides numerous benefits over conventional techniques. For example, some embodiments of the invention enable a physics data enhanced application to run properly on a variety of systems having a range of hardware and software capabilities. Some of these systems may lack any significant capability to run a physics simulation. Other systems may include a conventional, software-based physics engine. Yet other systems may include significant additional hardware resources specifically adapted to run a physics simulation, such as PPU.

In the specific context of a game application, embodiments of the invention allow game playability to be essentially the same across a range of competent systems, even where a physics simulation including additional actors, animation characteristics, and/or applied forces is used to improve the visual qualities of the game. In other embodiments, the invention allows an existing game application to be modified to make use of additional physics simulation capabilities without the risk of affecting the operation (e.g.: game playability) of the application. In yet other embodiments, the invention allows an existing application to be modified to make use of additional physics simulation capabilities without requiring the replacement of an existing physics engine, or physics API.

Throughout the description the term "physics simulation" has been used to broadly encompass any and all processes, data transfers, software executions, computations, etc, required to generate physics data. The term should not be construed are being limited to some unitary or monolithic piece of software. Rather, embodiments of the invention contemplate many different ways of defining and executing software on a variety of execution platforms to ultimately generate physics data sufficient to enhance animations resulting from execution of a main application. The actual partition, definition, and execution of the underlying software required to execute the desired physics simulation is a matter of individual design choices left to those of ordinary skill in the art.

What is claimed is:

1. A computer-implemented method, comprising:
    defining a first version of a scene within a main application, wherein the first version of the scene is configured for processing by a physics processing unit (PPU) to produce a first animation for display; and
    defining a second version of the scene within the main application, wherein the first and second scene versions differ in their degree of physics-related complexity and the second version of the scene is configured for processing only by a software-based physics engine running on a central processing unit (CPU) to produce a second animation for display;
    selecting one of the first version of the scene and the second version of the scene based on hardware capabilities to produce a selected version of the scene;
    processing the selected version of the scene using the hardware to produce the first animation or the second animation; and
    displaying the first animation or the second animation.

2. The method of claim 1, wherein the respective degrees of physics-related complexity for the first and second scene versions differ in relation to a number of scene actors, an actor animation characteristic, or a number of forces applied to an actor.

3. The method of claim 1, wherein the main application selects one of the first version of the scene and the second version of the scene at runtime.

4. The method of claim 2, wherein the first scene version comprises different actors than the second scene version.

5. The method of claim 2, wherein the first and second scene versions comprises at least one common actor.

6. The method of claim 5, wherein the common actor is animated in the first scene version having an animation characteristic absent in the animation of the common actor in the second scene version.

7. The method of claim 6, wherein the common actor is animated in the first scene version using a cloth simulation subroutine and the common actor is animated in the second scene version without using the cloth simulation subroutine.

8. A computer-implemented method of running a physics simulation associated with a main application on a system, the physics simulation defining, at least in part, a final scene and the method comprising:
  from the main application, calling an execution platform to create a first scene comprising a first actor and a second scene comprising a second actor and a third actor, wherein the first actor is a primary actor, the second actor is a proxy actor for the first actor, and the third actor is an additional actor;
  melding the first and second scenes to create the final scene, wherein the first actor participates in the physics simulation of the second scene without modification of a position, velocity, and orientation of the first actor by the physics simulation of the second scene, wherein melding the first and second scenes comprises establishing a one-way interaction relationship between the first actor and the third actor through the second actor; and
  rendering the final scene on a display associated with the system.

9. A computer-implemented method of executing a main application on a system, the main application incorporating physics data generated by a physics simulation, the method comprising:
  determining hardware resources available in the system to execute the physics simulation;
  selecting a scene version from a plurality of scene versions based on the determination of hardware resources, wherein the plurality of scene versions are defined during development of the main application and vary in their degree of physics-related complexity, and the main application is configured for execution by different systems that are characterized by a range of computational capabilities;
  processing the selected scene version using the hardware resources available in the system to produce an animation; and
  displaying the animation.

10. The method of claim 9, wherein the respective degrees of physics-related complexity for the plurality of scene versions are defined by at least one of; a number of scene actors, one or more animation characteristics associated with a scene actor, and a number of forces applied to a scene actor.

11. The method of claim 10, wherein multiple scene versions in the plurality of scene versions comprise a common actor.

12. The method of claim 11, wherein the common actor is processed using a cloth simulation subroutine in a first one of the multiple scene versions and the common actor is processed without using the cloth simulation subroutine in a second one of the multiple scene versions.

13. The method of claim 9, wherein the step of processing the selected scene version is performed using a Physics Processing Unit (PPU) co-processor.

14. A computer-implemented method of executing a main application on a system having multiple execution platforms, the main application incorporating physics data generated by a physics simulation, the method comprising:
  determining hardware resources available in the system to execute the physics simulation;
  selecting a scene version from a plurality of scene versions based on the determination of hardware resources, wherein the plurality of scene versions vary in their degree of physics-related complexity and are dynamically determined during execution of the main application by altering subroutines;
  identifying an execution platform associated with the selected scene version; and
  executing the selected scene version using the identified execution platform.

15. The method of claim 14, wherein the multiple execution platforms comprise at least one of a software-based physics engine running on a Central Processing Unit (CPU), a Physics Processing Unit (PPU) co-processor, or a combination of the physics engine and PPU co-processor.

16. The method of claim 15, wherein the multiple execution platforms comprise the physics engine and the PPU co-processor; and,
  wherein selecting a scene version from a plurality of scene versions comprises selecting a first scene to be generated by the physics engine and selecting a second scene version to be generated by the PPU co-processor.

17. A computer-implemented method of running a physics simulation associated with a main application on a system, the physics simulation defining, at least in part, a final scene and the method comprising:
  by operation of the main application, calling a first execution platform to execute a first physics simulation creating a first scene comprising a first actor;
  calling a second execution platform that is different than the first execution platform to execute a second physics simulation creating a second scene comprising a second actor and a third actor; and
  melding the first and second scenes to create the final scene.

18. The method of claim 17, wherein the calling the first and second execution platforms is accomplished through a physics Application Programming Interface (API).

19. The method of claim 17, wherein the calling the first execution platform is accomplished through a first physics API associated with the first execution platform, and
  wherein calling the second execution platform is accomplished through a second physics API associated with the second execution platform.

20. The method of claim 17, wherein the first platform is a physics processing unit (PPU) and the second platform is a software-based physics engine running on a central processing unit (CPU).

21. A computer-implemented method of running a physics simulation associated with a main application on a system, the physics simulation defining, at least in part, a final scene, the method comprising:

by operation of the main application, calling a first execution platform to execute a first physics simulation creating a first scene comprising a first actor;

calling a second execution platform that is different than the first execution platform to execute a second physics simulation and create a second scene comprising a second actor and a third actor, wherein the first actor is a primary actor, the second actor is a proxy actor for the primary actor, and the third actor is an additional actor; and melding the first and second scenes to create the final scene, wherein melding the first and second scenes comprises establishing a one-way interaction relationship between the first actor and the third actor through the second actor.

22. The method of claim 21, wherein melding the first and second scenes further comprises:

by operation of the first physics simulation, determining state data for the second actor in relation to the first actor;

communicating the state data for the second actor to the second physics simulation; and, by operation of the second physics simulation following receipt of the state data for the second actor, determining state data for the third actor.

23. The method of claim 22, wherein the second physics simulation does not change the state of the second actor.

24. The method of claim 21, wherein a position, a velocity, and an orientation of the proxy actor equals a position, a velocity, and an orientation of the primary actor.

25. The method of claim 8, wherein melding the first and second scenes further comprises:

by operation of the physics simulation, determining state data for the second actor in relation to the first actor, and determining state data for the third actor.

26. The method of claim 8, wherein the calling the execution platform is accomplished through a physics Application Programming Interface (API).

27. The method of claim 26, wherein the physics API is provided in association with the main application.

28. The method of claim 8, wherein melding the first and second scenes further comprises:

calling the physics API to define the one-way interaction relationship between the first actor and the third actor.

29. The method of claim 8, wherein the execution platform is a physics processing unit (PPU).

30. The method of claim 8, wherein state associated with the first actor in the first scene is used to execute the physics simulation to create the second scene.

* * * * *